United States Patent
Bazzi et al.

(10) Patent No.: US 10,928,455 B2
(45) Date of Patent: Feb. 23, 2021

(54) SYSTEM AND METHODS FOR FAULT DIAGNOSIS IN MACHINES

(71) Applicant: University of Connecticut, Farmington, CT (US)

(72) Inventors: Ali M. Bazzi, South Windsor, CT (US); Yiqi Liu, Storrs, CT (US); Bryan Davis, Nashua, NH (US)

(73) Assignee: University of Connecticut, Farmington, CT (US)

(*) Notice: Subject to any disclaimer, the term of this patent is extended or adjusted under 35 U.S.C. 154(b) by 137 days.

(21) Appl. No.: 16/388,333

(22) Filed: Apr. 18, 2019

(65) Prior Publication Data
US 2019/0324084 A1 Oct. 24, 2019

Related U.S. Application Data

(60) Provisional application No. 62/660,618, filed on Apr. 20, 2018.

(51) Int. Cl.
*G01R 31/34* (2020.01)
*G01R 31/50* (2020.01)
*G01R 19/25* (2006.01)

(52) U.S. Cl.
CPC ........... *G01R 31/343* (2013.01); *G01R 31/50* (2020.01); *G01R 19/25* (2013.01); *G01R 31/346* (2013.01)

(58) Field of Classification Search
CPC ...... G01R 19/007; G01R 19/25; G01R 31/34; G01R 31/343; G01R 31/346; G01R 31/50; G01R 31/52; G01R 31/54; G01R 31/55; G01R 31/56; G01R 31/72
See application file for complete search history.

(56) References Cited

U.S. PATENT DOCUMENTS

| | | | |
|---|---|---|---|
| 5,252,915 A | 10/1993 | Sedding | |
| 5,629,870 A * | 5/1997 | Farag | G01R 31/343 324/558 |
| 5,742,522 A * | 4/1998 | Yazici | G01R 31/343 324/545 |
| 6,636,823 B1 | 10/2003 | Unsworth et al. | |
| 7,081,760 B2 | 7/2006 | Mirafzal et al. | |
| 10,591,519 B2 * | 3/2020 | Qiao | F03D 17/00 |
| 2005/0184751 A1 * | 8/2005 | Hobelsberger | H02K 11/20 324/765.01 |

(Continued)

OTHER PUBLICATIONS

Cardoso, et al., Inter-Turn Stator Winding Fault Diagnosis in Three-Phase Induction Motors, by Park's Vector Approach, IEEE Transactions on Energy Conversion, vol. 14, No. 3, Sep. 1999, pp. 595-598.

Thomas, et al., Onlin Cage Rotor Fault Detection Using Air-Gap Torque Spectra, IEEE Transaction on Energy Conversion, vol. 18, No. 2, Jun. 2003, pp. 265-270.

(Continued)

*Primary Examiner* — Steven L Yeninas
(74) *Attorney, Agent, or Firm* — McCarter & English, LLP

(57) ABSTRACT

Systems and methods for fault detection and diagnosis in a machine. The method includes selecting fault characteristic frequencies of faults, implementing the fault characteristic frequencies as modulating signals, receiving a feedback signal from at least one sensor associated with a machine, applying active modulation using the modulating signals to the feedback signal to obtain modulated signals, and monitoring for a low-frequency fault indicative component from the modulated signals.

20 Claims, 7 Drawing Sheets

(56) References Cited

U.S. PATENT DOCUMENTS

| | | | | |
|---|---|---|---|---|
| 2010/0169030 | A1* | 7/2010 | Parlos | G01H 1/00 |
| | | | | 702/58 |
| 2012/0153935 | A1* | 6/2012 | Gao | H02P 23/14 |
| | | | | 324/163 |
| 2013/0338939 | A1* | 12/2013 | Nandi | G01R 31/346 |
| | | | | 702/38 |
| 2014/0152394 | A1* | 6/2014 | Chen | G01R 35/00 |
| | | | | 331/360 |
| 2014/0167810 | A1* | 6/2014 | Neti | G01R 31/34 |
| | | | | 324/765.01 |
| 2015/0260794 | A1 | 9/2015 | Athikessavan et al. | |
| 2016/0282416 | A1* | 9/2016 | Choi | G01R 23/20 |
| 2018/0348303 | A1* | 12/2018 | Unnikrishnan | F03D 17/00 |
| 2019/0003928 | A1* | 1/2019 | Unuma | G01M 13/04 |
| 2019/0058428 | A1* | 2/2019 | Barlini | F16C 19/00 |

OTHER PUBLICATIONS

Liu, et al. Online Rotor Mixed Fault Diagnosis Way Based on Spectrum Analysis of Instantaneous Power in Squirrel Cage Induction Motors, IEEE Transactions on Energy Conversion, vol. 19, No. 3, Sep. 2004, pp. 485-490.

Georgakopoulos, et al., Detection of Induction Motor Faults in Inverter Drives Using Inverter Input Current Analysis, IEEE Transactions on Energy Conversion, vol. 58, No. 9, Sep. 2011, pp. 4365-4373.

Ostojic, et al., Advanced Motor Monitoring and Diagnostics, IEEE Transactions on Inductry Applications, vol. 50, No. 5, Sep./Oct. 2014, pp. 3120-3127.

Mahmoud, et al., An Inverse Approach for Inter-Turn Fault Detection in Asynchronous Machines Using Magnetic Pendulous Oscillation Technique, IEEE, 2016, pp. 226-232.

U.S. Appl. No. 62/660,618, filed Apr. 20, 2018.

* cited by examiner

SYSTEM AND METHODS FOR FAULT DIAGNOSIS IN MACHINES

CROSS-REFERENCE TO RELATED PATENT APPLICATIONS

This application claims priority to U.S. Provisional Application No. 62/660,618, filed on Apr. 20, 2018, the content of which is hereby incorporated by reference in its entirety.

BACKGROUND

Induction machines are important machines that support loads in many safety-critical applications, such as electric vehicles, elevators and escalators, and heating and ventilation. Therefore, maintaining the health of induction machines is important. However, due to constant wear and tear, heavy and changing loads, enduring operation, possible harsh environments and many other factors, machine faults unavoidably occur; this could cause catastrophic consequences if they are not detected and prevented at an early stage.

BRIEF DESCRIPTION OF THE DRAWINGS

To assist those of skill in the art in making and using exemplary embodiments of the present disclosure, reference is made to the accompanying figures. The accompanying figures, which are incorporated in and constitute a part of this specification, illustrate one or more embodiments of the present disclosure and, together with the description, help to explain the present disclosure. Illustrative embodiments are shown by way of example in the accompanying drawings and should not be considered as limiting. In the figures.

DETAILED DESCRIPTION OF EMBODIMENTS

Figure 1:
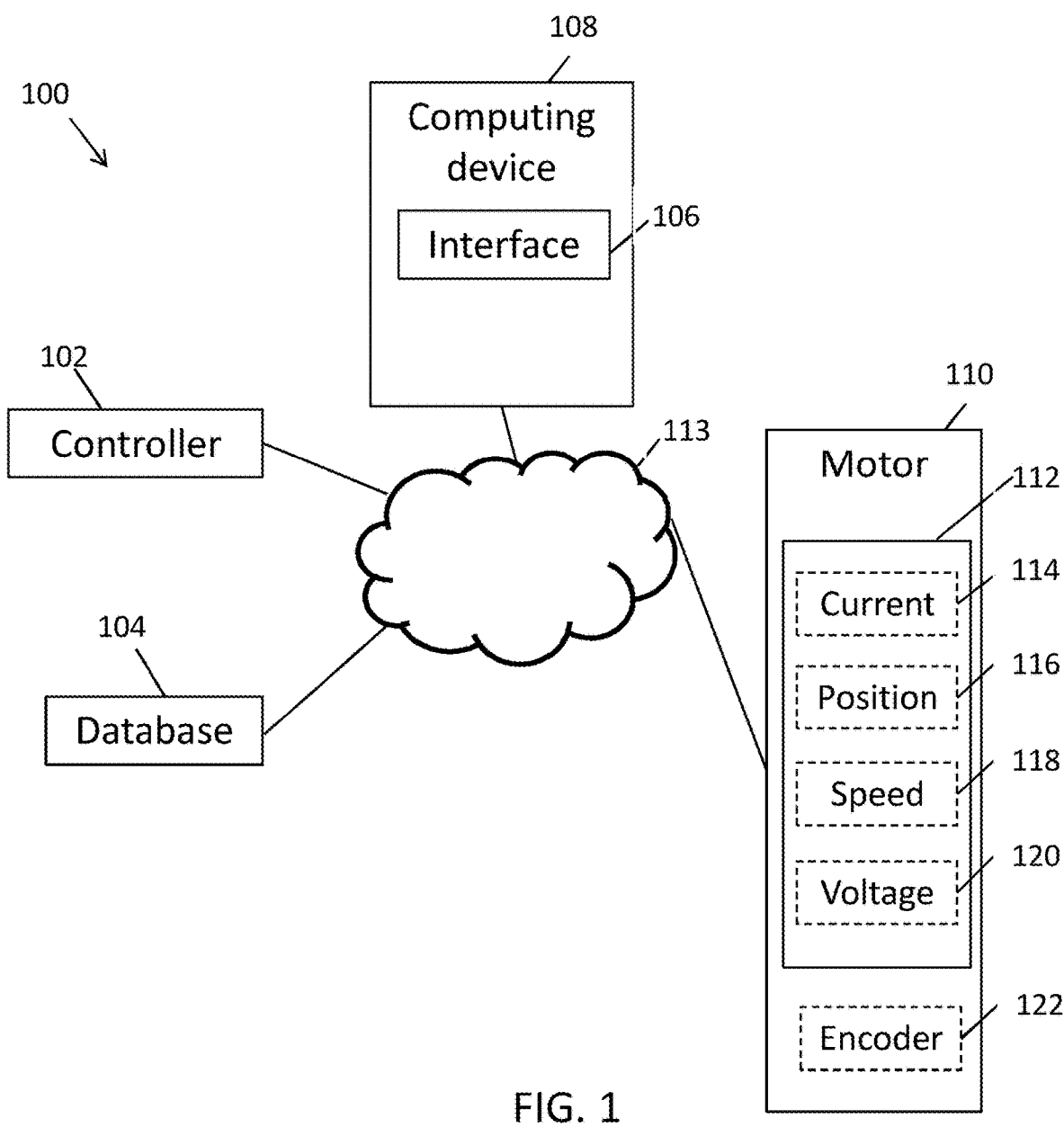
FIG. 1 illustrates an exemplary network environment for a system in accordance with embodiments of the present disclosure.

There are currently many fault detection and diagnosis (FDD) methods for alternating current (AC) motors. These methods can generally be categorized into time-domain FDD methods, frequency-domain FDD methods, time-frequency-domain FDD methods, and artificial intelligence (AI) methods. Time-domain FDD methods are implemented through checking abnormal changes of interested machine features along with time. In frequency-domain FDD methods, such as those using use Fast Fourier Transform (FFT) analyses, machine faults generate additional frequency components in various spectra due to resultant periodical vibration of mechanical forces and air-gap spacing. However, frequency-domain methods are typically slow due to computational complexity. Time-frequency-domain FDD methods provide an inspection of a machine's dynamic features via continuous spectral analysis using a small moving time window, but uses complex computations. Finally, artificial-AI methods model complex nonlinear systems by using certain structures and rules based on the understanding of the system's behavior. AI methods place less emphasis on the physical structure and intermediate results of the system and attempt to emulate the input/output relationship directly.

However, there remains an unmet need for improved, faster, simpler methods for fault detection and diagnosis in induction machines, which can detect multiple fault types using a single approach.

Disclosed herein are systems and methods for detecting and diagnosing faults in machines, particularly AC induction machines such as motors and generators. The system includes a controller communicatively coupled to one or more sensors associated with the machine and configured to receive a current feedback signal from the one or more sensors. As described in detail herein, the controller uses artificial modulating signals, which have theoretical model-based fault frequencies, to modulate the machine current feedback signal. The controller applies active modulation to the machine current feedback signal in order to accentuate fault-indicative signals, thus making the subsequent isolation and detection of the fault-indicative signals easier. The controller is configured to monitor a fundamental frequency and/or other periodic frequencies of the machine to detect machine faults.

The modulating signals are based on estimated characteristic frequencies of faults to be detected, as shown in Table I below. The modulation and fault detection occur in a side loop that does not disturb the current feedback signal nor interfere with control of the machine; rather, the controller processes the feedback in a separate algorithm to extract fault information. Thus, it facilitates hardware implementation on devices of limited memory and processing capabilities.

For ease of explanation, the disclosed systems and methods for detecting and diagnosing machine faults is described in three steps as follows.

At step 1, the controller selects from a database one or more fault characteristic frequencies for one or more faults using the equations shown in Table I. Table I illustrates estimated fault frequencies for different major types of faults, where k1 to k7 are integers related to the harmonic order of fault signals; $f_e$ is the synchronous frequency in Hz; s and P are the machine's slip and number of poles, respectively; $N_b$ and $N_s$ are the number of bearing rolling balls and rotor slots, respectively; and $N_d$ and $N_w$ are the orders of rotating eccentricity and stator magneto-motive force harmonics, respectively. In additional embodiments, further fault characteristic frequencies may be added to Table I to detect additional types of faults.

TABLE I

| Fault | | Fault Characteristic Frequency Components |
|---|---|---|
| Eccentricity fault | Dynamic and mixed EF | $f_{ef1} = f_e \left[ 1 \pm \dfrac{2k_1(1-s)}{P} \right]$ |
| | Principal slot harmonics | $f_{ef2} = f_e \left[ \dfrac{2(k_2 N_s \pm N_d)(1-s)}{P} \pm N_w \right]$ |
| Bearing Fault | Simplified inner-race/ outer-race BF | $\begin{bmatrix} f_{ir} \\ f_{or} \end{bmatrix} = f_e + \begin{bmatrix} 0.6 k_3 N_b f_{rm} \\ 0.4 k_4 N_b f_{rm} \end{bmatrix}$ |

TABLE I-continued

| | |
|---|---|
| Broken Rotor Bar Fault | $f_{brbf} = f_e[1 \pm 2k_5 s]$ Fault Characteristic Frequency Components |
| Stator Short Winding Fault (SSWF) | $f_{sswf} = f_e\left[\frac{2k_6(1-s)}{P} \pm k_7\right]$ |

The controller selects the fault characteristic frequencies for each of the faults and implements these frequencies as modulating signals, each in its own separate side loop.

At step 2, the controller applies adaptive modulation using each modulating signal to the received current feedback signal to obtain modulated signals. In order to attenuate relatively high frequency fault-irrelevant components so that a fault indicative component is more distinctive, the controller applies a low pass filter (LPF), mean function, and notch filter to each modulated signal to filter out the fault-irrelevant components. The fault-indicative component is a slowest component in a modulated signal after the signal processing.

At step 3, the controller verifies the existence of the slow fault-indicative component. Since the fault-indicative signal is the slowest component of the modulated signal, this component can be detected by checking the zero-crossing points of the modulated signal after processing. To do so, the controller continuously monitors time $T_t$ and whether $T_t$ surpasses a threshold $T_{th}$, which is the maximum $T_t$ of a no-fault signal. $T_t$ is a time between a runtime and an instance of the last zero-crossing point of the processed modulated signal. $T_t$ in a faulty signal can be much larger than $T_t$ in a no-fault signal. If $T_t$ surpasses the threshold $T_{th}$, the low-frequency fault indicative component has been detected. $T_{th}$ can be predefined or can be determined by the maximum drift of $\omega_f$ from $\omega_m$ during the machine's healthy stage due to practical imperfections, where $\omega_f$ is a real fault frequency and $\omega_m$ has the value of the theoretical fault frequency (e.g., the modulating signal). For example, if $T_{th}$ is set to 0.5 seconds, then a real signal that is within 1 Hz from the estimated fault frequency would flag a fault. Otherwise, no fault is flagged.

The disclosed systems and methods occur in real time and are self-adaptive to the change of speed and torque. The disclosed systems and methods use an adaptive time-domain fault detection method with excellent fault sensitivity and robustness of fault detection in the presence of noise and current harmonics. Furthermore, the disclosed systems and methods require minimal signal processing and no additional sensors other than those already in motor drives for other control purposes and no extra hardware other than that needed for closed-loop regulatory control. No frequency-domain calculations, wavelet processing, machine learning, or other more complex algorithms or complex hardware are involved. The disclosed systems and methods can quickly and accurately diagnose major types of AC motor faults, including, but not limited to, stator short winding fault (SSWF), broken rotor bar fault (BRBF) when rotor bars exist, eccentricity fault (EF), and bearing fault (BF) in their early stages. These types of faults can be detected before they reach full intensity and flagged as requiring maintenance prior to failure.

The benefits of the disclosed systems and methods over previously used methods are at least fourfold. First, fault detection and diagnosis using the disclosed systems and methods are simple and require minimal signal processing. Second, additional sensors, beyond those typically incorporated in motors for other purposes, are not needed. Third, major types of motor faults, particularly AC motor faults, can be detected, even if more than one type of fault is present concurrently. Lastly, the disclosed systems and methods offer fast detection, minimizing the time that the machines run while damaged.

Extensive simulation and verifications have been performed, and the described systems and methods show excellent fault sensitivity and robustness to noise at different speed, torque, fault magnitude, magnitude of the modulating signal, and drift frequency conditions. In the tests, the disclosed systems and methods can accurately detect faults with a magnitude less than 2% of the current fundamental. In addition, the disclosed systems and methods can also be extended to other types of faults for which there are mathematical expressions for the fault frequencies. Moreover, the adaptive modulation disclosed herein can be applied to other feedback signals, such as vibration signals, in a similar approach to the disclosed use of the current feedback.

While induction motors are used as an example herein, the disclosed systems and methods apply to various other motor types and other induction machines. The disclosed systems and methods can be implemented in motor drives wherever AC motors are utilized. For example, the disclosed systems and methods have applications in industrial plants and other settings where motors are constantly running, such as conveyor belt operations, paper production, oil drilling, ship propulsion, water pumping, chiller plants, transportation (ground, marine, aerospace), HVAC and in manufacturing operations. Because the disclosed systems and methods quickly and accurately diagnose major types of faults in their early stage, costly machine downtimes are reduced in manufacturing processes and other operations that rely on these motors. Moreover, where AC motors are implemented in safety-critical applications, such as elevators, electric vehicles, weapon systems, etc., the disclosed systems and methods can be employed to recognize a fault soon enough to prevent catastrophic failure.

FIG. 1 illustrates an exemplary network environment for a system 100 in accordance with embodiments of the present disclosure. The system 100 can include a controller 102, a database 104, an electronic user interface 106 on a computing device 108, and a motor 110 associated with one or more sensors 112. These components may be in wired communication 113 or wireless communication 113 with each other. The database 104 holds estimated fault frequencies for different faults, as described herein. In exemplary embodiments, the motor 110 and controller 102 may be located on or within a same machine, such as a vehicle.

Often the one or more sensors 112 are already present in a design of the motor 110. The one or more sensors 112 may be connected to a control system of the motor 110 and typically include current sensor(s) 114, position sensor(s) 116, speed sensor(s) 118, and/or voltage sensor(s) 120. In exemplary embodiments, the motor 110 has one or more current sensors 114. The controller 102 require a source of information on motor speed, which may be obtained directly from the speed sensor 118 or from a position encoder 122, from which a speed estimate may be calculated. The accuracy of the speed estimation affects the accuracy and reliability of fault detection and diagnosis by the controller 102. Typically, current sensors 114 are used for current regulation and/or over-current protection, flux estimation, and then flux regulation. Voltage sensors 120 are used for flux estimation and flux regulation. The encoder 122 is used for reference transform, which is an essential aspect of motor control but can be replaced with a position estimator.

In some embodiments, the controller 102 may regulate (e.g., slowdown) or shut down the motor 110 when a fault is detected. In additional embodiments, the controller 102 may transmit a status of fault detection to the electronic user interface 106. For example, the controller 102 may transmit a warning notification to the electronic user interface 106 when a fault is detected. Conversely, the controller 102 may transmit a status to the electronic user interface 106 that no fault has been detected.

Figure 2:
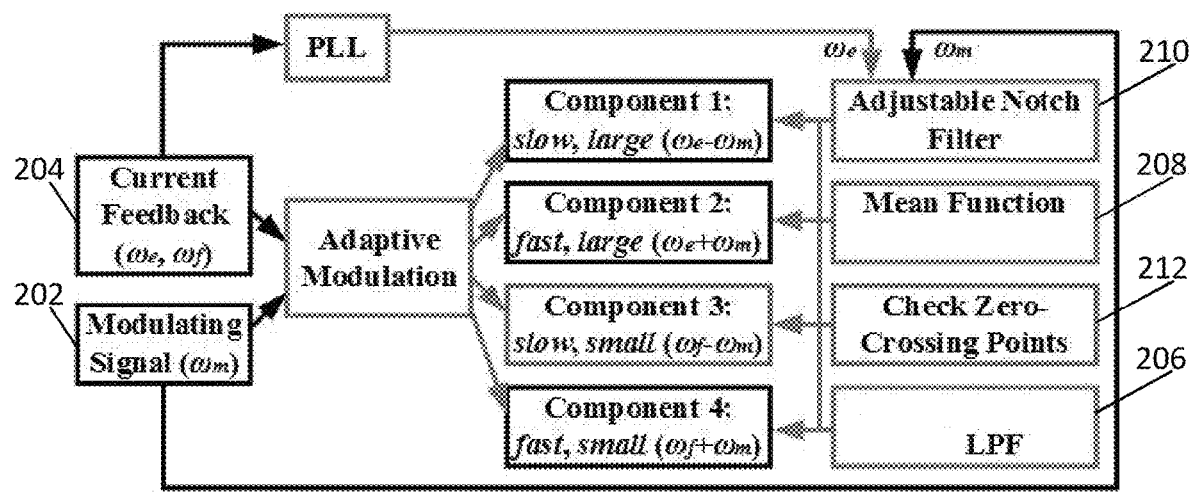
FIG. 2 illustrates adaptive modulation and signal processing in accordance with an exemplary embodiment.

FIG. 2 illustrates adaptive modulation and signal processing in accordance with an exemplary embodiment. Signal processing is performed to attenuate relatively high-frequency fault-irrelevant components so that the fault-indicative component is more distinctive. To achieve this goal, the controller uses a low-pass filter (LPF) 206, an average or mean function 208, and a notch filter 210 for $\omega_e$ and $\omega_m$ components, where $\omega$ is a frequency in rad/s, $\omega_e$ is a synchronous fault frequency and is obtained using a phase-lock loop (PLL) on the current feedback signal, $\omega_f$ is a real fault frequency, and $\omega m$ has the value of the theoretical fault frequency (e.g., the modulating signal) and is known.

The controller applies adaptive modulation using a modulating signal 202 to the current feedback signal 204 to obtain the modulated signal. The LPF 206, the mean function 208, and the notch filter 210 are applied to the modulated signal to filter out fault-irrelevant components. The controller checks 212 zero-crossing points of the modulated signal and identifies the slowest component in the modulated signal. The fault-indicative component is the slowest component in the modulated signal. The controller performs the fault detection and diagnosis through checking the existence of this slow fault-indicative component.

As shown in FIG. 2, components 1, 2, and 4 are not of interest as they are either too fast indicating a major drift from the fault frequency, or are slow but not related to the fault frequency. Component 3 is slow, and shows that the modulating frequency $\omega_m$ is very close to $\omega_f$, which means that the modulating signal is almost at the same frequency as the unknown fault frequency.

FIGS. 3A-3E illustrate fault-indicative signals and no fault-indicative signals, according to an exemplary embodiment.

Figure 3A:
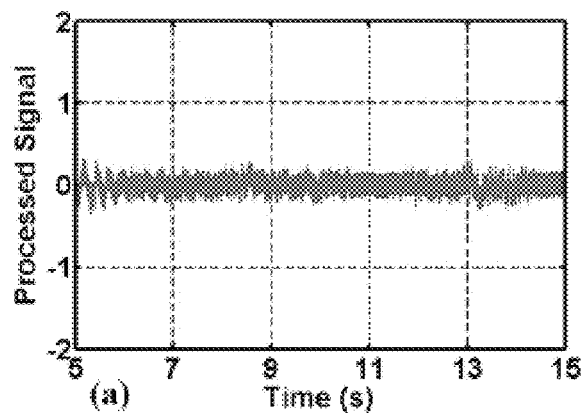
FIGS. 3A-3E illustrate fault-indicative signals and no fault-indicative signals in accordance with an exemplary embodiment.
Figure 3B:
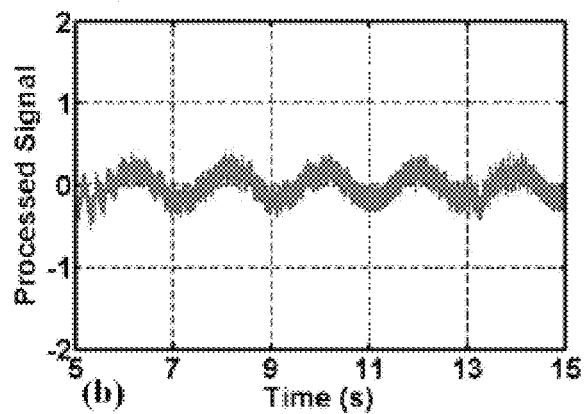
Figure 3C:
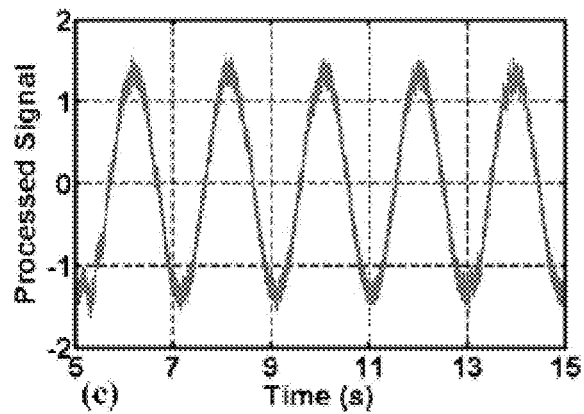

FIGS. 3A-3C shows different types of processed signals to illustrate a difference between a no-fault-indicative component and a fault-indicative component. FIG. 3A illustrates a no-fault-indicative component where the signal has only high-frequency ripple centered around zero. FIG. 3B illustrates a small fault-indicative component with relatively large ripple. FIG. 3C illustrates a large fault indicative component with relatively small ripple and higher-frequency ripples when a fault happens.

Figure 3D:
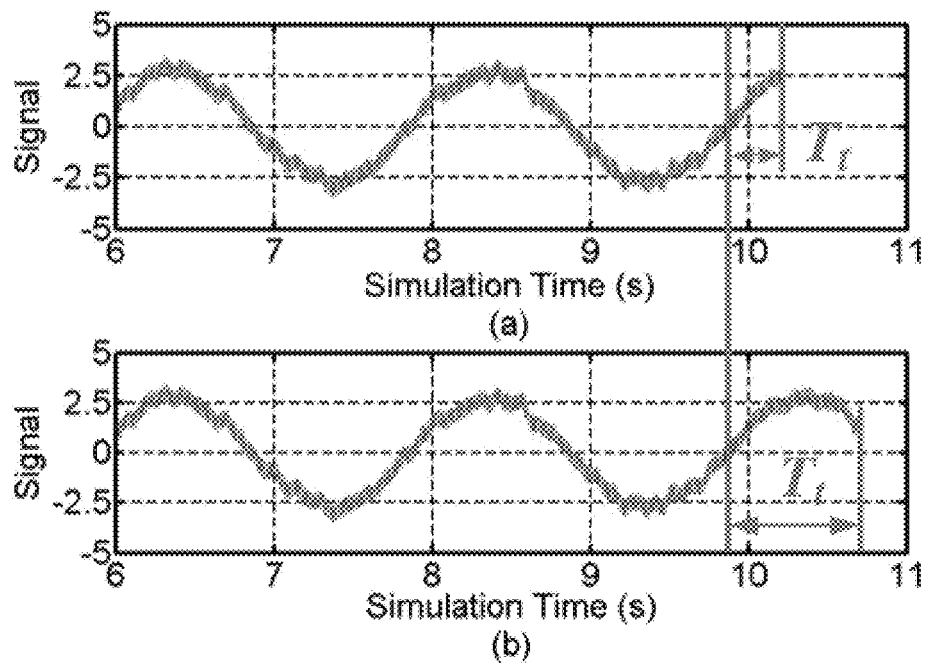
Figure 3E:
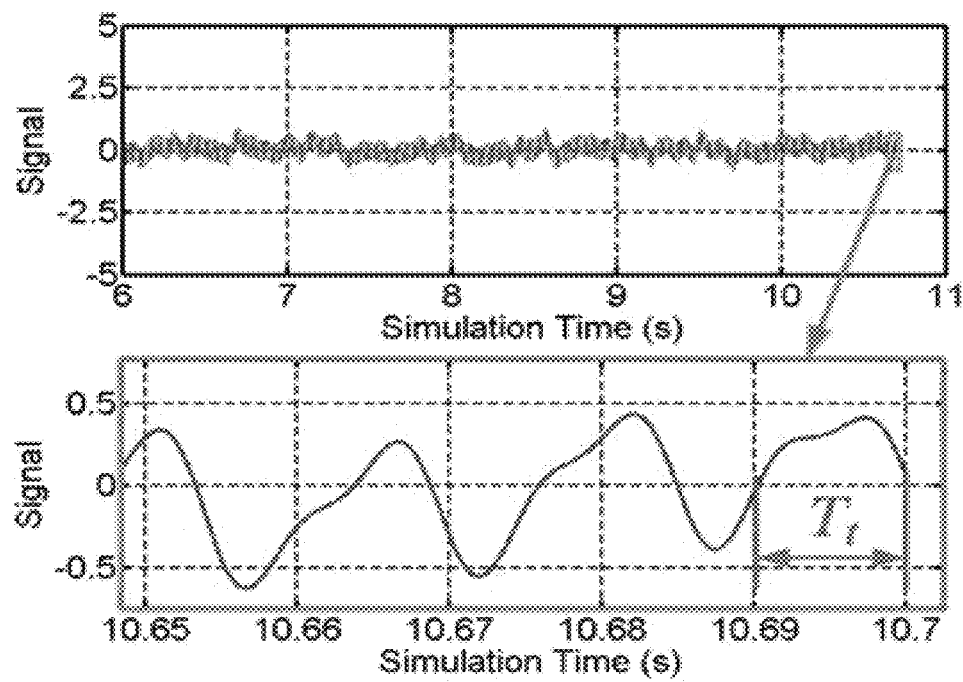

Since the fault-indicative signal is the slowest component of the modulated signal, this component can be detected by checking the zero-crossing points of the modulated signal after processing. Where $T_t$ is a time between a runtime and an instance of the last zero-crossing point of the processed modulated signal, an example of $T_t$ for different runtimes of a fault-indicative signal is shown in FIG. 3D, and $T_t$ for a no-fault signal is shown in FIG. 3E. $T_t$ in faulty signals can be much larger than $T_t$ in no-fault signals. The possible maximum $T_t$, which is about half period of the slowest frequency component, is much larger when a fault occurs. For example, FIG. 3D shows $T_t$ of a fault-indicative signal at runtime of 10.2 s (a) and 10.7 s (b). In FIG. 3E shows $T_t$ of a no-fault signal, where $T_t$ is about 0.01 seconds.

If $T_t$ is larger than a threshold $T_{th}$, which is the maximum $T_t$ of a no-fault signal, it signifies that the low-frequency fault-indicative component has been detected and a fault is flagged. If $T_t$ does not surpass a user-defined threshold $T_{th}$, then the fault-indicative slow signal is not present and a fault is not flagged.

Figure 4:
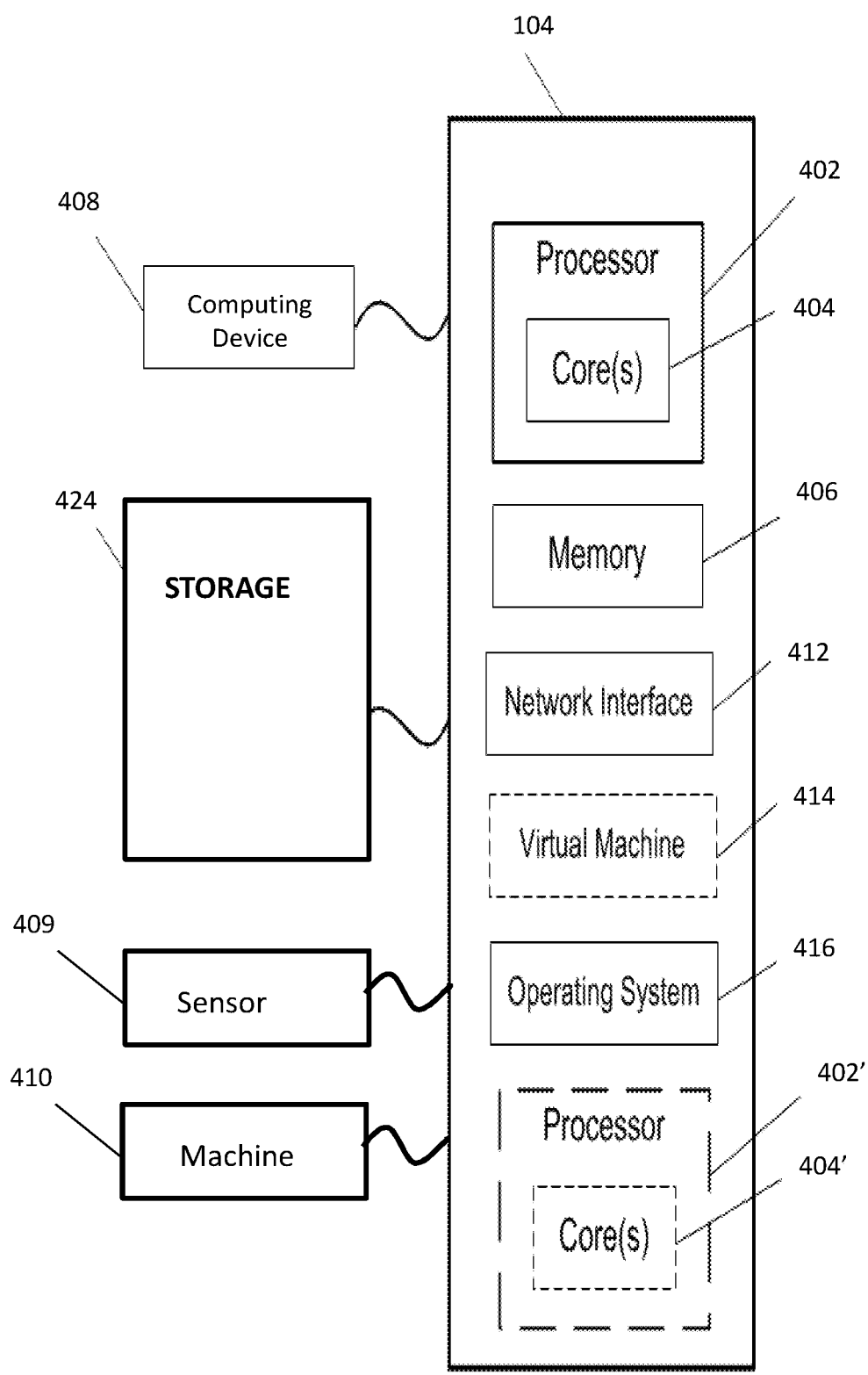
FIG. 4 is a schematic view of a controller in accordance with an exemplary embodiment.

FIG. 4 is a schematic view of the controller 102 according to an exemplary embodiment. The controller 102 includes one or more non-transitory computer-readable media for storing one or more computer-executable instructions or software for implementing exemplary embodiments. The non-transitory computer-readable media can include, but are not limited to, one or more varieties of hardware memory, non-transitory tangible media (for example, one or more magnetic storage disks, one or more optical disks, one or more USB flash drives), and the like. For example, a memory 406 included in the controller 102 can store computer-readable and computer-executable instructions or software for implementing exemplary embodiments. The controller 102 also includes a processor 402 and an associated core 404, and optionally, one or more additional processor(s) 402' and associated core(s) 404' (for example, in the case of computer systems having multiple processors/cores), for executing computer-readable and computer-executable instructions or software stored in memory 406 and other programs for controlling system hardware. Processor 402 and processor(s) 402' can each be a single core processor or multiple core (404 and 404') processor.

In some embodiments, the controller 102 may be in communication with a computing device 408 that displays an electronic user interface such as a browser application or web application for displaying notifications and statuses associated with fault diagnosis and detection. For example, the computing device 408 can be a computer system, such as a workstation, desktop computer, server, laptop, handheld computer, tablet computer, mobile computing or communication device, or other form of computing or telecommunications device that is capable of communication and that has sufficient processor power and memory capacity to perform the operations described herein. The application on the computing device 408 can enable a user to view that a fault has been detected and information associated with the fault. In some embodiments, a user can interact with the controller 102 through the computing device 408. The computing device 408 may also display other aspects, elements and/or information or data associated with exemplary embodiments, such as a history of identified faults. The controller 102 may include other I/O devices for receiving input from a user, for example, a keyboard or any suitable multi-point touch interface, a pointing device (e.g., a pen, stylus, mouse, or trackpad). The keyboard and pointing device may be coupled to the computing device 408. The controller 102 may include other suitable conventional I/O peripherals.

Virtualization can be employed in the controller 102 so that infrastructure and resources in the computing device can be shared dynamically. A virtual machine 414 can be provided to handle a process running on multiple processors so that the process appears to be using only one computing resource rather than multiple computing resources. Multiple virtual machines can also be used with one processor.

Memory 406 can include a computer system memory or random access memory, such as DRAM, SRAM, EDO RAM, and the like. Memory 406 can include other varieties of memory as well, or combinations thereof.

The controller 102 can also include one or more storage devices 424, such as a hard-drive, CD-ROM, or other computer readable media, for storing data and computer-readable instructions and/or software that implements embodiments of the controller 102, as described herein, or portions thereof. In an exemplary embodiment, the storage device 424 includes the estimated fault frequencies for different faults. Exemplary storage device 324 can also store one or more storage devices for storing any suitable information required to implement exemplary embodiments.

The controller 102 can include one or more interfaces 412 configured to interface and communicate with the computing device 408, one or more sensors 409, and/or a machine 410, such as a motor drive of a vehicle. The interface 412 may further include a network interface configured to interface with one or more networks, for example, Local Area Network (LAN), Wide Area Network (WAN) or the Internet through a variety of connections including, but not limited to, standard telephone lines, LAN or WAN links (for example, 802.11, T1, T3, 56 kb, X.25), broadband connections (for example, ISDN, Frame Relay, ATM), wireless connections, controller area network (CAN), or some combination of any or all of the above. The interface 412 can include a built-in network adapter, network interface card, PCMCIA network card, card bus network adapter, wireless network adapter, USB network adapter, modem or any other device suitable for interfacing the controller 102 to any variety of networks capable of communication and performing the operations described herein.

The controller 102 can run any operating system 416, such as any of the versions of the Microsoft® Windows® operating systems, the different releases of the Unix and Linux operating systems, any version of the MacOS® for Macintosh computers, any embedded operating system, any real-time operating system, any open source operating system, any proprietary operating system, any operating systems for mobile computing devices, or any other operating system capable of running on the computing device and performing the operations described herein. In exemplary embodiments, the operating system 416 can be run in native mode or emulated mode. In an exemplary embodiment, the operating system 416 can be run on one or more cloud machine instances.

Figure 5:
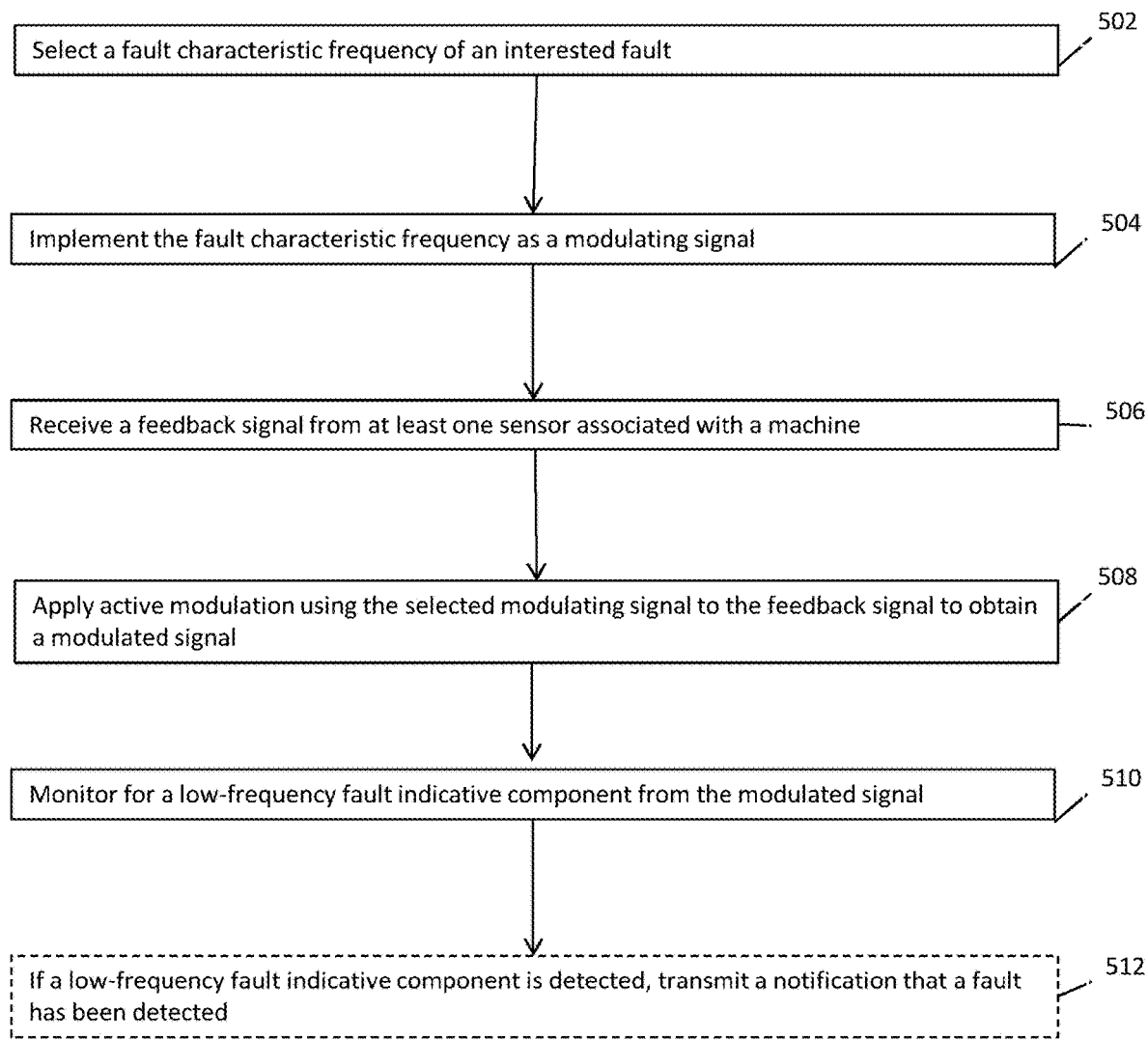
FIG. 5 is a flowchart illustrating an exemplary method for detecting and diagnosing faults in machines in accordance with an exemplary embodiment.

FIG. 5 is a flowchart illustrating an exemplary method 500 for fault detection and diagnosis in a machine, in accordance with an exemplary embodiment. At step 502, a controller selects at least one fault characteristic frequency of a fault, for example, a fault of interest. At step 504, the controller implements the fault characteristic frequency as a modulating signal. At step 506, the controller receives a feedback signal from at least one sensor associated with a machine. At step 508, the controller applies active modulation using the modulating signal to the feedback signal to obtain a modulated signal. At step 510, the controller monitors for a low-frequency fault indicative component from the modulated signal. At step 512, if a low-frequency fault indicative component is detected, the controller transmits a notification that a fault has been detected.

The description herein is presented to enable any person skilled in the art to detect and/or diagnose faults in machines, as described herein. Various modifications to the example embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention may be practiced without the use of these specific details. In other instances, well-known structures and processes are shown in block diagram form in order not to obscure the description of the invention with unnecessary detail. Thus, the present disclosure is not intended to be limited to the embodiments shown, but is to be accorded the widest scope consistent with the principles and features disclosed herein.

In describing exemplary embodiments, specific terminology is used for the sake of clarity. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps can be replaced with a single element, component or step. Likewise, a single element, component or step can be replaced with a plurality of elements, components or steps that serve the same purpose. Moreover, while exemplary embodiments have been shown and described with references to particular embodiments thereof, those of ordinary skill in the art will understand that various substitutions and alterations in form and detail can be made therein without departing from the scope of the invention. Further still, other aspects, functions and advantages are also within the scope of the invention.

Exemplary flowcharts are provided herein for illustrative purposes and are non-limiting examples of methods. One of ordinary skill in the art will recognize that exemplary methods can include more or fewer steps than those illustrated in the exemplary flowcharts, and that the steps in the exemplary flowcharts can be performed in a different order than the order shown in the illustrative flowcharts.

We claim:

1. A method for fault detection and diagnosis in a machine, the method comprising:
   selecting one or more fault characteristic frequencies of one or more faults;
   implementing the one or more fault characteristic frequencies as modulating signals in separate loops to diagnose the one or more faults simultaneously;
   receiving a feedback signal from at least one sensor associated with a machine;
   applying active modulation using each modulating signal to the feedback signal to obtain modulated signals; and
   monitoring for low-frequency fault indicative components from the modulated signals,
   wherein if a low-frequency fault indicative component is detected, transmitting a notification that a fault has been detected.

2. The method of claim 1, wherein the machine is an induction machine.

3. The method of claim 2, wherein the induction machine is an alternating current (AC) motor.

4. The method of claim 3, further comprising receiving, via the at least one sensor, information on a motor speed of the AC motor.

5. The method of claim 1, wherein the at least one sensor is a current sensor.

6. The method of claim 1, wherein the low-frequency fault indicative component is a slowest component in a modulated signal.

7. The method of claim 1, wherein the one or more faults is selected from a stator short winding fault (SSWF), a broken rotor bar fault (BRBF), an eccentricity fault (EF), or a bearing fault (BF).

8. The method of claim 1, wherein monitoring for a low-frequency fault indicative component further comprises:

monitoring a time between a runtime and an instance of the last zero-crossing point; and determining whether the time is larger than a threshold.

9. The method of claim 1, further comprising transmitting the notification to an electronic user interface.

10. The method of claim 1, further comprising controlling the machine when a fault is detected.

11. A system for fault detection and diagnosis in a machine, the system comprising:

a database holding a plurality of fault characteristic frequencies;

a controller communicatively coupled to the database and configured to:

select one or more fault characteristic frequencies of one or more faults from the plurality of fault characteristic frequencies;

implementing the one or more fault characteristic frequencies as modulating signals in separate loops to diagnose the one or more faults simultaneously;

receive a feedback signal from at least one sensor associated with a machine;

apply active modulation using each modulating signal to the feedback signal to obtain modulated signals; and monitor for low-frequency fault indicative components from the modulated signals;

wherein if a low-frequency fault indicative component is detected, transmit a notification that a fault has been detected.

12. The system of claim 11, wherein the machine is an induction machine.

13. The system of claim 12, wherein the induction machine is an alternating current (AC) motor.

14. The system of claim 13, the controller further configured to receive, via the at least one sensor, information on a motor speed from the AC motor.

15. The system of claim 11, wherein the at least one sensor is a current sensor.

16. The system of claim 11, wherein the low-frequency fault indicative component is a slowest component in the modulated signal.

17. The system of claim 11, the controller further configured to select the one or more faults from a stator short winding fault (SSWF), a broken rotor bar fault (BRBF), an eccentricity fault (EF), and a bearing fault (BF).

18. The system of claim 11, the controller further configured to monitor for a low-frequency fault indicative component by:

monitoring a time between a runtime and an instance of the last zero-crossing point; and determining whether the time is larger than a threshold.

19. The system of claim 11, the controller further configured to transmit the notification to a user interface.

20. The system of claim 11, the controller further configured to control the machine when a fault is detected.

* * * * *